(12) United States Patent
Joo et al.

(10) Patent No.: US 10,732,780 B2
(45) Date of Patent: Aug. 4, 2020

(54) TOUCH INPUT DEVICE HAVING CONNECTION MEMBER ELECTRICALLY CONNECTING SENSOR ELECTRODE AND PRINTED CIRCUIT BOARD BY CONTACT AND METHOD FOR MANUFACTURING THE SAME

(71) Applicants: Hyundai Motor Company, Seoul (KR); Kia Motors Corporation, Seoul (KR); Seoyon Electronics Co., Ltd., Suwon-si (KR)

(72) Inventors: Sihyun Joo, Seoul (KR); Nae Seung Kang, Siheung-si (KR); Jungsang Min, Seoul (KR); Jongmin Oh, Suwon-si (KR); Sam Min Park, Incheon (KR); Jun Sam Choi, Anyang-si (KR)

(73) Assignees: Hyundai Motor Company, Seoul (KR); Kia Motors Corporation, Seoul (KR); Seoyon Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/213,155

(22) Filed: Dec. 7, 2018

(65) Prior Publication Data

US 2019/0196621 A1 Jun. 27, 2019

(30) Foreign Application Priority Data

Dec. 27, 2017 (KR) ........................ 10-2017-0180345

(51) Int. Cl.
*G06F 3/044* (2006.01)
*H05K 1/18* (2006.01)
(Continued)

(52) U.S. Cl.
CPC ........... *G06F 3/044* (2013.01); *H01R 12/722* (2013.01); *H05K 1/181* (2013.01); *H05K 3/341* (2013.01);
(Continued)

(58) Field of Classification Search
CPC ........... G06F 2203/04103; G06F 3/044; H01R 12/722; H05K 1/181; H05K 2201/10151; H05K 2201/1031; H05K 3/341
See application file for complete search history.

(56) References Cited

U.S. PATENT DOCUMENTS

| 6,507,337 B1* | 1/2003 | Sato ........................ G06F 3/045 |
|---|---|---|
| | | 345/173 |
| 2012/0032917 A1* | 2/2012 | Yamaguchi ........... G06F 3/0416 |
| | | 345/174 |

(Continued)

FOREIGN PATENT DOCUMENTS

| JP | 2010-043346 A | 2/2010 |
|---|---|---|
| JP | 2017-059231 A | 3/2017 |

(Continued)

*Primary Examiner* — Ram A Mistry
(74) *Attorney, Agent, or Firm* — Morgan, Lewis & Bockius LLP

(57) ABSTRACT

A touch input device including a connection member electrically connecting a sensor electrode and a printed circuit board by contact without soldering may include a base including a metal complex, an electrode groove formed by irradiating a laser on the base, a sensor electrode formed on the electrode groove through a plating or deposition process and including a conductive material, a sensor IC to sense a change in capacitance of the sensor electrode, a printed circuit board on which the sensor IC is mounted and is disposed to be coupled with the base, and the connection member provided on the printed circuit board and configured to electrically connect the sensor electrode and the printed circuit board, wherein the connection member may (Continued)

elastically come into contact with the sensor electrode to connect the sensor electrode and the printed circuit board.

15 Claims, 10 Drawing Sheets

(51) Int. Cl.
*H05K 3/34* (2006.01)
*H01R 12/72* (2011.01)
(52) U.S. Cl.
CPC .............. *G06F 2203/04103* (2013.01); *H05K 2201/1031* (2013.01); *H05K 2201/10151* (2013.01)

(56) References Cited

U.S. PATENT DOCUMENTS

| | | | |
|---|---|---|---|
| 2013/0082970 A1* | 4/2013 | Frey | G06F 3/0414 345/173 |
| 2015/0146899 A1 | 5/2015 | Dzarnoski et al. | |
| 2015/0305147 A1* | 10/2015 | Tombs | G06F 3/047 345/174 |

FOREIGN PATENT DOCUMENTS

| | | |
|---|---|---|
| KR | 10-1531818 B1 | 6/2015 |
| KR | 10-1545019 B1 | 8/2015 |
| KR | 10-2016-0131696 A | 11/2016 |

* cited by examiner

TOUCH INPUT DEVICE HAVING CONNECTION MEMBER ELECTRICALLY CONNECTING SENSOR ELECTRODE AND PRINTED CIRCUIT BOARD BY CONTACT AND METHOD FOR MANUFACTURING THE SAME

CROSS-REFERENCE TO RELATED APPLICATION(S)

The present application claims priority to Korean Patent Application No. 10-2017-0180345, filed on Dec. 27, 2017, the entire contents of which is incorporated herein for all purposes by this reference.

BACKGROUND OF THE INVENTION

Field of the Invention

The present invention relates to a touch input device and method for manufacturing the touch input device, and more particularly, to a touch input device with electrodes disposed by a laser process and method for manufacturing the touch input device.

Description of Related Art

A touch input device is one of the devices that configure interfaces between an information and communication terminal with various displays and a user. The touch input device enables human-terminal interface when the user directly contacts or approaches a touch pad or touch screen using an input tool, such as his or her finger or a touch pen.

To implement a touch input device configured for being manipulated by touch, resistive, capacitive, surface acoustic wave, transmitter methods, etc., are used. The touch input device using the capacitive method may include a type that forms crossing electrode patterns and detects an input position by detecting a change in capacitance between electrodes when an input device, such as a finger comes into contact with the touch input device. There is another type that applies the same electric potential of a phase to both terminals of a transparent conductive film and detects an input position by detecting a small current that flows when a capacitance is formed by an input device, such as a finger coming into contact with or approaching the touch input device.

Recently, a touch input device having various shapes has been provided. For example, a touch input device having a curved surface with different curvatures has been developed.

Conventional printed circuit board type touch input devices cannot meet the required specifications due to a difference in height between a center portion and an external portion thereof when an overlay having a curved surface with different curvatures is attached to an upper surface of a printed circuit board.

In conventional film type touch input devices, it is possible to implement a touch input device having a simple curved surface, but it is difficult to implement a curved surface having different curvatures.

In recent years, research has been conducted using a laser patterning technique to form electrodes directly on an injection molded material to implement a touch input device having a curved surface with different curvatures.

However, a soldering process is required to connect a printed circuit board with electrodes formed by laser processing. As the soldering process is added, the cost of the touch input device may be increased, and the performance of the touch input device may be deteriorated depending on the soldering quality. Furthermore, the production yield of the touch input device may be lowered due to poor soldering.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a touch input device including a connection member electrically connecting a sensor electrode and a printed circuit board by contact without soldering, and a method for manufacturing the touch input device.

Various aspects of the present invention are directed to providing a touch input device having a reduced rate of defects and improved production yield, and a method for manufacturing the touch input device.

Various aspects of the present invention are directed to providing a touch input device in which the manufacturing cost is reduced and productivity is improved by simplifying a manufacturing process, and a method for manufacturing the touch input device.

Additional aspects of the disclosure will be set forth in part in the description which follows and, in part, will be apparent from the description.

In accordance with an aspect of the present invention, a touch input device may include a base including a metal complex, an electrode groove formed by irradiating a laser on the base, a sensor electrode formed on the electrode groove through plating or a deposition process, and including a conductive material, a sensor IC to sense a change in capacitance of the sensor electrode; a printed circuit board on which the sensor IC is mounted and is arranged to be coupled with the base, and a connection member provided on the printed circuit board and configured to electrically connect the sensor electrode and the printed circuit board. The connection member may elastically come into contact with the sensor electrode to connect the sensor electrode and the printed circuit board.

The connection member may be detachably coupled to the sensor electrode.

The connection member may include a conductive material.

The base may include at least one bent or curved surface, and the electrode groove and the sensor electrode may be formed on the at least one bent surface or the curved surface.

One end portion of the sensor electrode may extend to a position corresponding to the connection member to come into contact with the connection member.

The connection member may be coupled to the printed circuit board by soldering.

The connection member may be configured to be elastically deformable to maintain connection with the sensor electrode when vibration occurs in the base and the printed circuit board.

In accordance with another aspect of the present invention, a method for manufacturing a touch input device may include forming an electrode groove by irradiating a laser on a base including a metal complex, forming a sensor electrode including a conductive material on the electrode groove through a plating process or a deposition process, and coupling a printed circuit board including a connection member to the base.

The coupling of the printed circuit board to the base may include electrically connecting the sensor electrode and the printed circuit board by elastically contacting the connection member with the sensor electrode.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
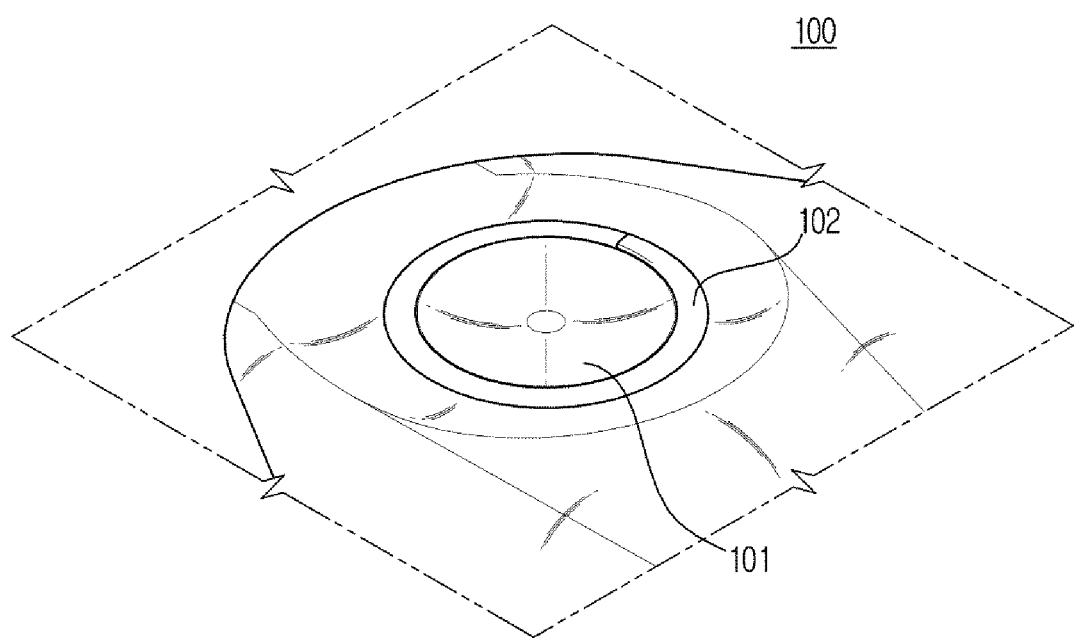
FIG. 1 is a view illustrating a touch input device according to an exemplary embodiment of the present invention.

It may be understood that the appended drawings are not necessarily to scale, presenting a somewhat simplified representation of various features illustrative of the basic principles of the invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made more specifically to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the other hand, the invention(s) is/are intended to cover not only the exemplary embodiments, but also various alternatives, modifications, equivalents and other embodiments, which may be included within the spirit and scope of the invention as defined by the appended claims.

Hereinafter, a touch input device in which a via hole is formed in a base, that is, a 1.5-layer touch input device will be referred to as an example, but the present invention is not limited thereto. A touch input device may be a double-layer touch input device in which a base may include two layers disposed vertically, a first pattern groove and a first sensor electrode are formed in the first layer, and a second pattern groove and a second sensor electrode are formed in the second layer. Furthermore, a touch input device may be provided in various ways.

FIG. 1 is a view illustrating a touch input device according to an exemplary embodiment of the present invention.

A touch input device 100 according to the exemplary embodiment of the present invention may include a touch portion 101.

The touch portion 101 may include a certain area configured for receiving a touch signal of the user. For example, as shown in FIG. 1, the touch portion 101 may be provided in a concave curved surface with different curvatures. Alternatively, the touch portion 101 may be provided in a convex curved surface with different curvatures, and may not be limited thereto. Curvatures may be greater than that shown in the drawings. Furthermore, the touch portion 101 may be provided not as a curved surface but as a polygonal surface. The touch portion may be provided as a flat surface instead of a convex or concave curved surface.

The touch portion 101 may be a touch pad to which a signal is input when the user contacts it with a pointer, such as his or her finger or a touch pen. The user may input a desired instruction or command by inputting a predetermined touch gesture to the touch portion 101. Furthermore, the user may input the desired instruction or command by varying the time contacting with the touch portion 101.

Recognizing the pointer's position while the pointer is not contacting but approaching the touch pad is called 'proximity touch,' and recognizing the pointer's position when the pointer contacts the touch pad is called 'contact touch.' Proximity touch is made by recognizing a position on the touch pad vertically corresponding to a position in the air where the pointer approaches the touch pad.

The touch portion 101 may use capacitive methods.

Figure 9:
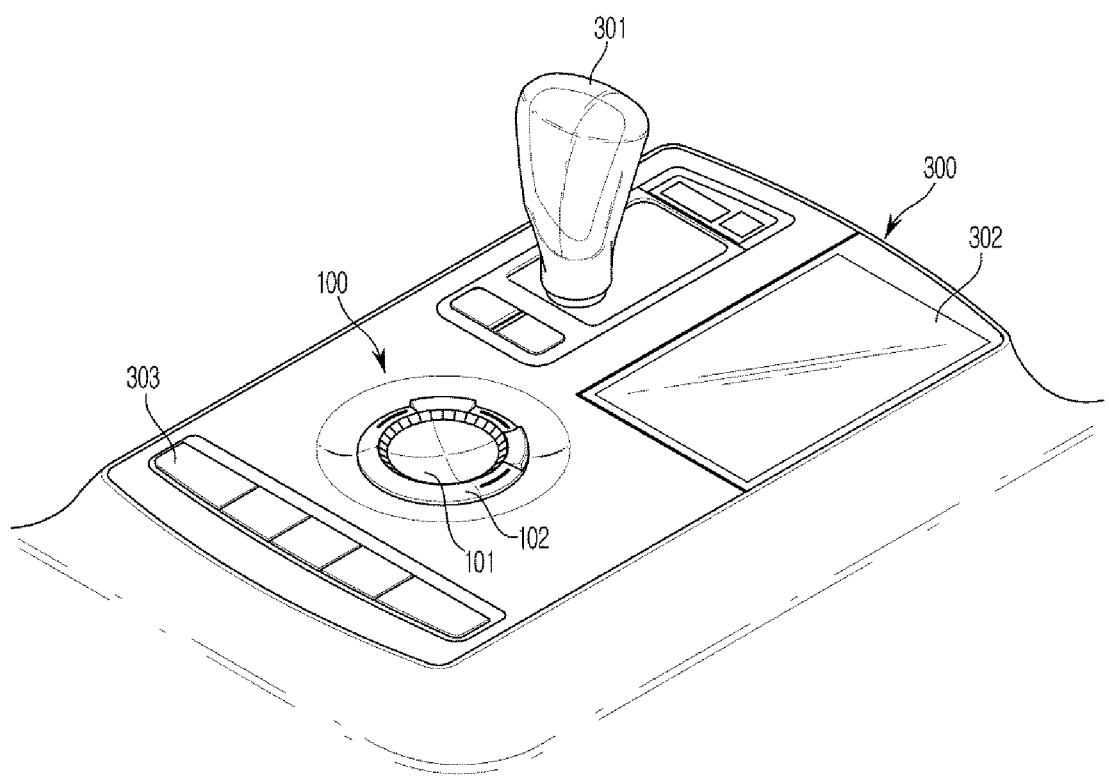
FIG. 9 is a perspective view illustrating a gear box provided with a touch input device according to an exemplary embodiment of the present invention.

The touch portion 101 may be disposed on the internal side of a border portion 102. The border portion 102 may refer to a portion that encloses the touch portion 101, and may be formed of a separate member from that of the touch portion 101. As shown in FIG. 9, scales that may be felt by touch are formed on the border portion 102, so that the user can intuitively know a swype angle or distance. Therefore, by making it possible to input different signals according to the swype angles or distances, the degree of freedom of manipulation and the input accuracy may be improved. As described above, the border portion 102 may be provided to receive a swype input of the user. The touch portion 101 may be provided to receive a gesture input of the user. The swype input denotes an action of inputting a gesture clockwise or counterclockwise without taking the pointer off the border portion 102. The gesture input denotes an action of inputting a straight line or a curved line gesture without taking the pointer off the touch portion 101.

Figure 2:
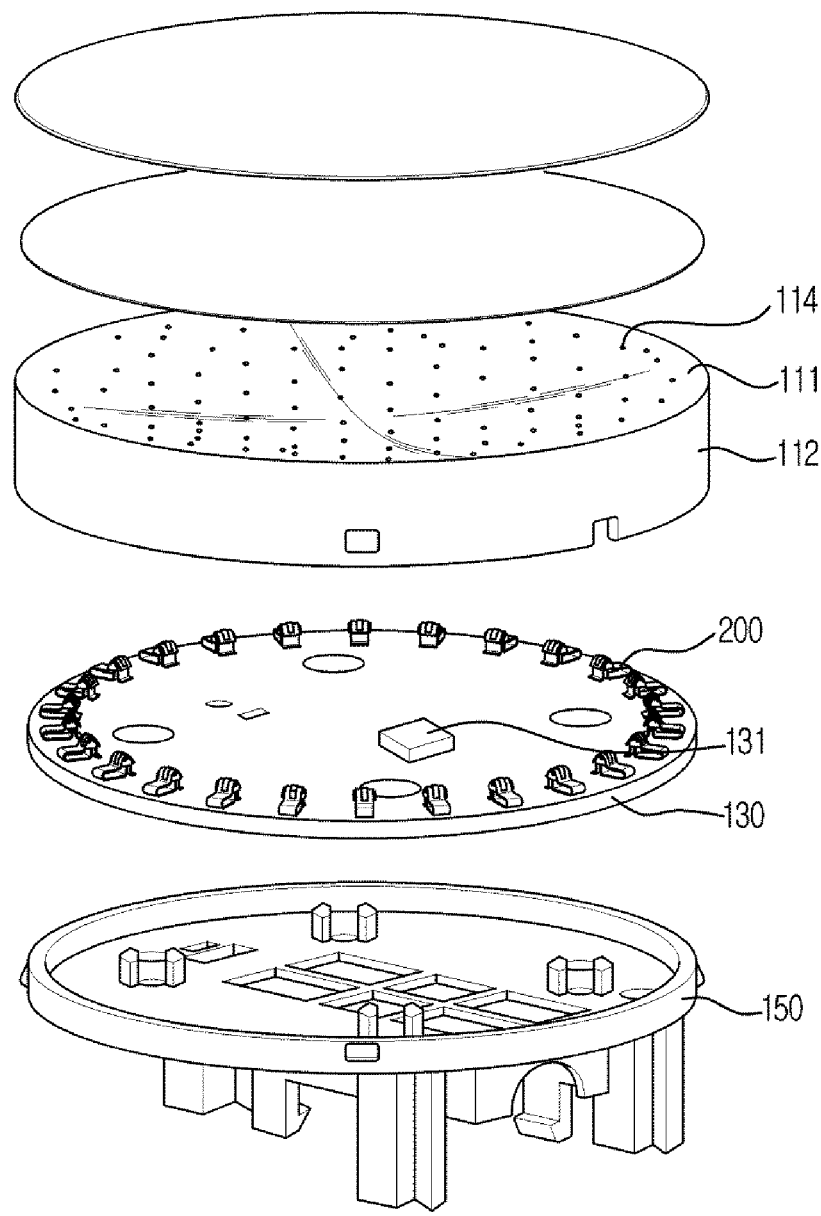
FIG. 2 is an exploded perspective view illustrating a touch input device according to an exemplary embodiment of the present invention.

FIG. 2 is an exploded perspective view illustrating a touch input device according to an exemplary embodiment of the present invention.

As illustrated in FIG. 2, the touch input device 100 according to the exemplary embodiment of the present invention may include a base 110 having a metal complex, electrode grooves 113 (see FIG. 5) formed in a touch area 111 of the base 110, sensor electrodes 120 formed on the electrode grooves 113 by a plating or deposition process, via holes 114 penetrating the base 110, connection electrodes 123 connecting the sensor electrodes 120 through the holes 114, a printed circuit board 130 on which a sensor IC 131 electrically connected to the sensor electrodes 120 is mounted to sense a change in capacitance of the sensor electrodes 120, and connection members 200 provided on the printed circuit board 130 and electrically connecting the printed circuit board 130 and the sensor electrodes 120. The printed circuit board 130 may be coupled to the base 110. The connection members 200 may be detachably coupled to the sensor electrodes 120.

The base 110 may include a metal complex. This is to form the sensor electrodes 120 by the LDS (Laser Direct Structuring) method. The LDS method refers to a method of forming a conductive structure in a region of a support member exposed to a laser by forming the support member with a material including a non-conductive and chemically stable metal complex, exposing a metal seed by exposing a portion of the supporting member to a laser, such as an Ultra Violet (UV) laser or Excimer laser to break the chemical bond of the metal complex, and deposition the supporting member.

The base 110 may include the touch area 111 used as a touch pad and a peripheral portion 112 extending downwardly from an external edge portion of the touch area 111. The touch area 111 may be formed as a concave or convex curved surface, but is not limited thereto, and may be provided in a polygonal surface or in a flat surface.

The electrode grooves 113 may be formed in the touch area 111 of the base 110. The electrode grooves 113 may be formed by irradiating the base 110 with a laser. The electrode grooves 113 may be formed on an upper surface and a lower surface of the touch area 111, respectively. This is to form the sensor electrodes 120 and the connection electrodes 123 by a plating or deposition process.

The sensor electrodes 120 and the connection electrodes 123 may be formed on the electrode grooves 113 after a plating or deposition process.

That is, the sensor electrodes 120 (see FIG. 3) may be formed on the base 110 using the LDS method.

The sensor electrodes 120 include a conductive material and may be metal. Copper (Cu) may be used among metals in consideration of conductivity and cost. The sensor electrodes 120 may be formed of metal such as gold (Au) in addition to copper.

The holes 114 may be formed in the touch area 111 of the base 110. A plurality of via holes 114 may be formed throughout the touch area 111. The holes 114 may be formed before irradiating the base 110 with a laser. That is, the holes 114 may be formed together with the base 110 when the base 110 is manufactured by injection molding or the like.

The holes 114 may be in contact with the sensor electrodes 120. Considering the process order, the sensor electrodes 120 may be formed on the holes 114.

The holes 114 may connect the sensor electrodes 120 which are separated from each other. The connection electrodes 123 may be formed on the bottom surface of the base 110.

The printed circuit board 130 may be coupled to a lower portion of the base 110. The sensor IC 131 may be mounted on the printed circuit board 130. The sensor IC 131 may be electrically connected to the sensor electrodes 120 to sense a change in capacitance of the sensor electrodes 120.

The printed circuit board 130 may include the connection member 200 to electrically connect the sensor electrodes 120 and the printed circuit board 130.

The connection member 200 may be provided in plural. The connecting members 200 may be disposed apart from each other along the periphery of the printed circuit board 130. The connection member 200 may come into contact with an end portion 124 (see FIG. 6) of the sensor electrode 120 to electrically connect the sensor electrode 120 and the printed circuit board 130. A detailed description of the connection member 200 will be described later.

A support 150 may be provided under the base 110 and the printed circuit board 130. The support 150 may be provided to fix the base 110 and the printed circuit board 130, and is not an essential component. The support 150 may be provided to fix the touch input device 100 at a specific position such as the internal to a vehicle.

Figure 3:
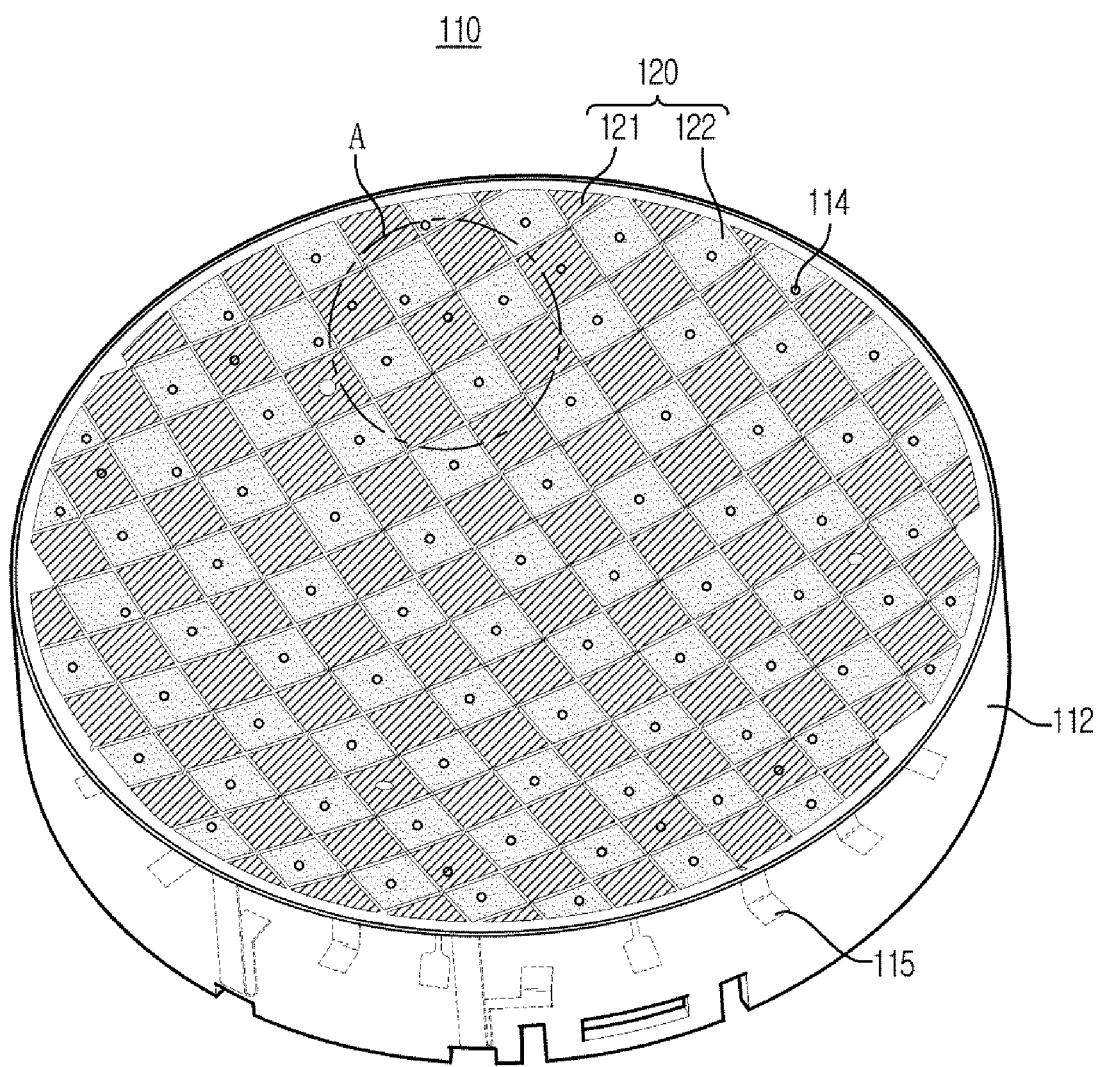
FIG. 3 is a view illustrating a base of a touch input device according to an exemplary embodiment of the present invention.
Figure 4:
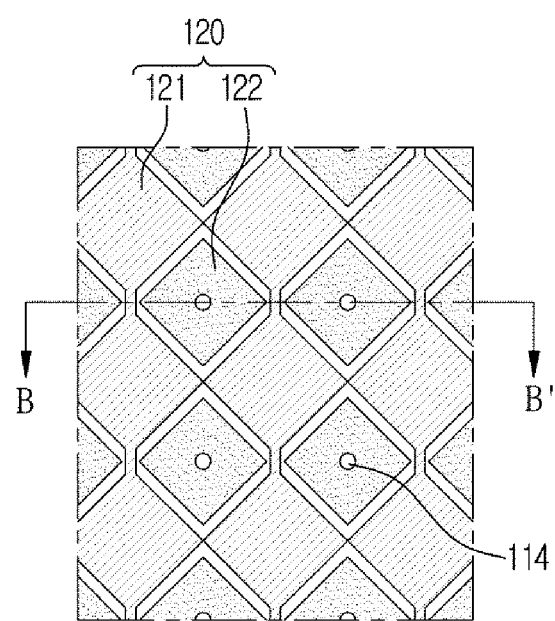
FIG. 4 is an enlarged view of a portion A shown in FIG. 3.
Figure 5:
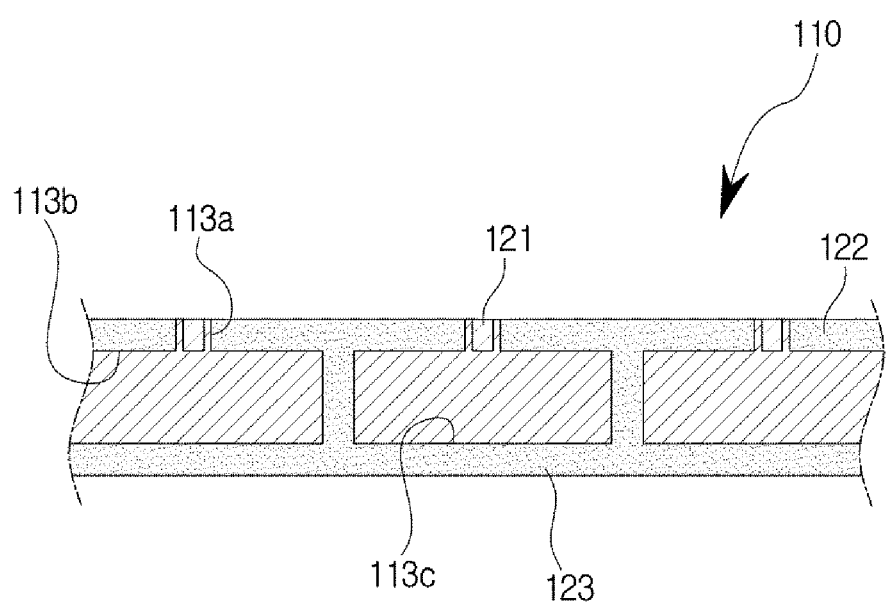
FIG. 5 is a cross-sectional view taken along line B-B' in FIG. 4.
Figure 6:
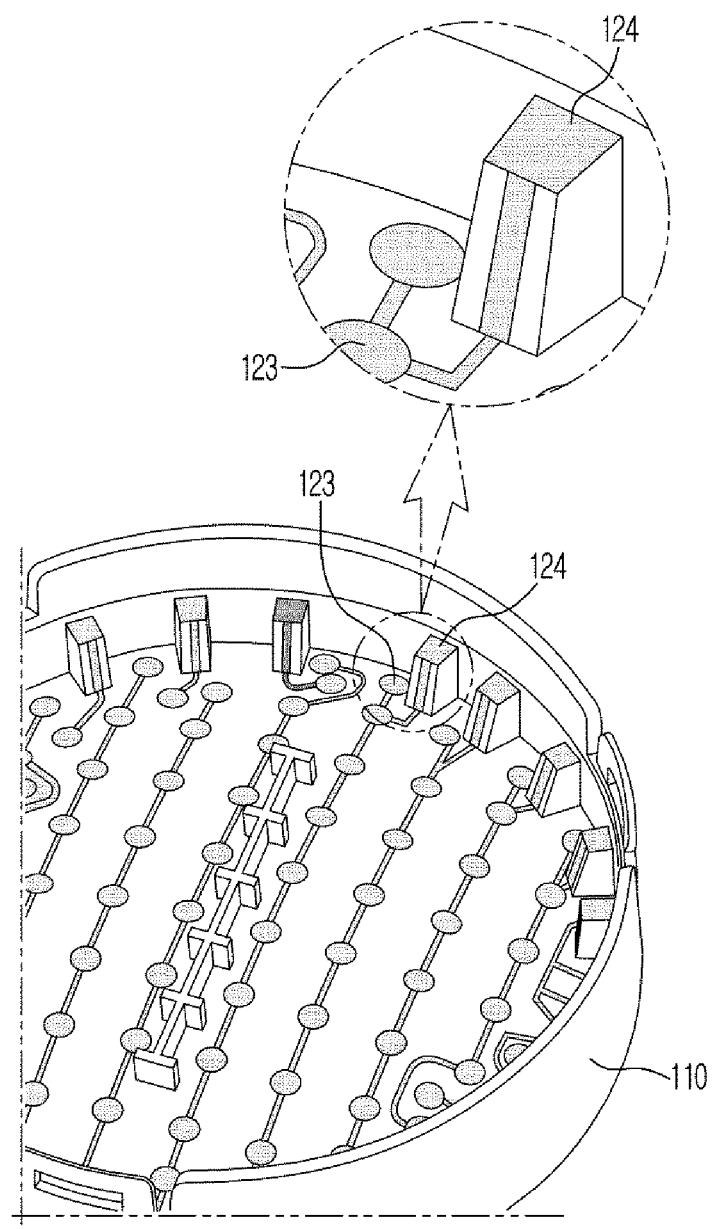
FIG. 6 is a view illustrating a portion of a bottom surface of the base shown in FIG. 3.
Figure 7:
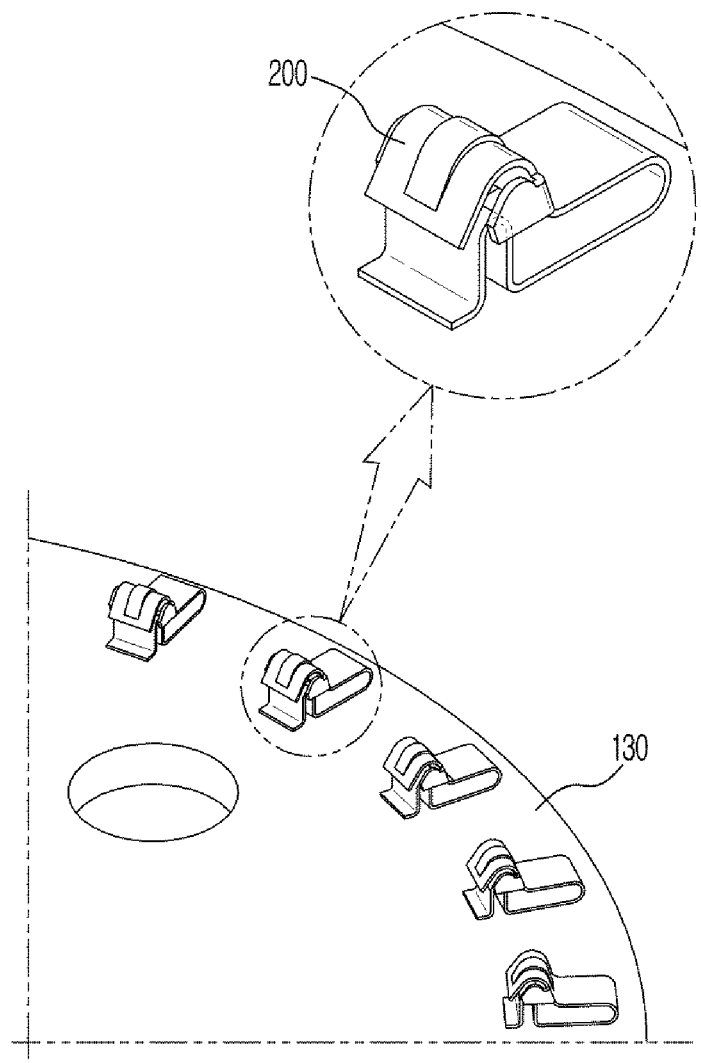
FIG. 7 is a view illustrating a connection member of a touch input device according to an exemplary embodiment of the present invention.

FIG. 3 is a view illustrating a base of a touch input device according to an exemplary embodiment of the present invention, FIG. 4 is an enlarged view of a portion A shown in FIG. 3, FIG. 5 is a cross-sectional view taken along line B-B' in FIG. 4, FIG. 6 is a view illustrating a portion of a bottom surface of the base shown in FIG. 3, and FIG. 7 is a view illustrating a connection member of a touch input device according to an exemplary embodiment of the present invention.

The sensor electrodes 120 in an exemplary embodiment of the present invention will be described more specifically with reference to FIG. 3 to FIG. 6.

The sensor electrodes 120 may be formed on the upper surface of the touch area 111 of the base 110. The sensor electrodes 120 may be formed on the lower surface of the touch area 111. In the instant case, a distance between the sensor electrodes 120 and the pointer may be increased by a thickness of the base 110 and sensitivity for touch may be reduced. Therefore, the sensor electrodes 120 are formed on the upper surface of the base 110.

The sensor electrodes 120 may be formed on the upper surface of the base 110 using the LDS as described above.

The sensor electrodes 120 may include first sensor electrodes 121 directly connected to each other on the upper surface of the base 110 and second sensor electrodes 122 separated from each other on the upper surface of the base 110. The first sensor electrodes 121 may be formed on first electrode grooves 113a formed on the upper surface of the base 110 by a plating process or a deposition process. The second sensor electrodes 122 may be formed on second electrode grooves 113b formed on the upper surface of the base 110 by a plating process or a deposition process.

The first sensor electrodes 121 may be transmitting electrodes (TX electrodes), and the second sensor electrodes 122 may be receiving electrodes (RX electrodes). Alternatively, the first sensor electrodes 121 may be receiving electrodes (RX electrodes), and the second sensor electrodes 122 may be transmitting electrodes (TX electrodes).

The first sensor electrodes 121 may be directly connected to each other on the upper surface of the base 110. The first sensor electrodes 121 may be connected to each other even if separate connection electrodes are not provided. The first sensor electrodes 121 may be connected to each other along a first direction thereof. The first sensor electrodes 121 may not be connected to each other along a second direction perpendicular to the first direction thereof. That is, the first sensor electrodes 121 may be separated from each other in the second direction thereof.

The second sensor electrodes 122 may be separated from each other on the upper surface of the base 110. The second sensor electrodes 122 may be separated not only in the first direction but also in the second direction perpendicular to the first direction thereof.

The first sensor electrodes 121 and the second sensor electrodes 122 may be disposed in a crossing manner along the second direction thereof. That is, the first sensor electrodes 121 and the second sensor electrodes 122 may be alternately disposed along the second direction thereof.

The holes 114 may be formed on a lower portion of the second sensor electrodes 122. According to the manufacturing process of the touch input device 100, since the holes 114 are formed together with the base 110 and the sensor electrodes 120 are formed on the base 110 using the LDS method, the second sensor electrodes 122 may be formed on an upper portion of the holes 114.

The second sensor electrodes 122 may be connected to each other through the holes 114. The second sensor electrodes 122 may be connected by the connection electrodes 123 formed on the lower surface of the base 110. The connection electrodes 123 may be formed on third electrode grooves 113c formed on the lower surface of the base 110 by a plating process or deposition process.

As illustrated in FIG. 6, the connection electrodes 123 may connect the holes 114 disposed adjacent to each other. The connection electrodes 123 may be formed on the lower surface of the base 110. The connection electrodes 123 may be formed on the lower surface of the base 110 by use of the LDS method, like the sensor electrodes 120. The connection electrodes 123 and the second sensor electrodes 122 may be connected through the holes 114.

According to various aspects of the present invention, the sensor electrode 120 and the printed circuit board 130 may be electrically connected by contacting the base 110 and the printed circuit board 130 without a separate fastening mechanism. The sensor IC 131 may be mounted on the printed circuit board 130. When the printed circuit board 130 is electrically connected to the sensor electrode 120, the sensor IC 131 and the sensor electrode 120 may be electrically connected.

As illustrated in FIG. 7, a plurality of connection members 200 may be provided on the edge portion of the printed circuit board 130. The connecting member 200 may be a C-Clip contact. The connection member 200 may have various shapes, and the shape of the connection member 200 is not particularly limited.

The connection member 200 may include a conductive material. This is to electrically connect the sensor electrode 120 and the printed circuit board 130.

The connection member 200 may be elastically deformable. When the connection member 200 electrically connects the sensor electrode 120 and the printed circuit board 130, the connection member 200 is not disconnected with the sensor electrode 120 even if vibration is applied.

Since the connection member 200 is provided, the touch input device 100 does not require a separate soldering process to connect the printed circuit board 130 and the sensor electrode 120.

Conventionally, to electrically connect the sensor electrode 120 and the printed circuit board 130, a soldering process is indispensable, such as directly soldering a flexible printed circuit board to a sensor electrode surface or connecting a connector to the sensor electrode surface to solder. Also, the soldering process used in the instant case was not a general soldering process but a robot soldering process. The robot soldering process has a problem in that the production yield is lowered due to a high defect rate compared with the general soldering process. Furthermore, there is a problem in that the cost is increased due to the addition of the robot soldering process. As the robot soldering process is added, the production process becomes complicated and the time required for manufacturing the touch input device increases, which may lead to a decrease in productivity. Also, the performance of the sensor electrode may deteriorate depending on the soldering quality, which leads to a decrease in performance of the product.

As described above, the connection member 200 may electrically connect the printed circuit board 130 and the sensor electrode 120 without soldering. The sensor electrode 120 and the printed circuit board 130 may be electrically connected only by assembling the printed circuit board 130 to the base 110 without a separate fastening mechanism. The production process of the touch input device 100 may be simplified, the yield may be increased, and the production cost may be reduced. Furthermore, the production rate may be improved, and since the connection member has the contact structure with the sensor electrode, the influence of soldering on the touch sensitivity may be reduced.

The sensor electrode 120 may extend to a position corresponding to the connection member 200 to be in contact with the connection member 200.

The end portion 124 of the sensor electrode 120 may extend to a connection portion 115 formed on the lower surface of the base 110. A plurality of connection portions 115 may be provided. The connection portions 115 may be spaced from each other along the periphery of the lower surface of the base 110 to correspond to the connection members 200. The connection portion 115 may be provided in a substantially rectangular parallelepiped shape. The connection portion 115 may be disposed to connect the lower surface of the base 110 and the peripheral portion 112. However, the shape of the connection portion may be variously provided. It is sufficient that the connection portion is provided at a position corresponding to the connection member to be in contact with the connection member when the base and the printed circuit board are assembled.

The end portion 124 of the sensor electrode 120 may be formed on the connection portion 115. When the connection member 200 contacts the connection portion 115, the end portion 124 of the sensor electrode formed on the connection portion 115 may contact the connection member 200. The connection member 200 is electrically conductive and electrically connected to the sensor electrode 120 by contacting the end portion 124 of the sensor electrode.

As described above, the base 110 may be coupled to the printed circuit board 130 without a separate fastening mechanism. Conventionally, a robot soldering process was used for the electrical connection between a sensor electrode and a printed circuit board, but the present resulted in a reduction in yield. On the other hand, the touch input device 100 according to an exemplary embodiment of the present invention does not require the robot soldering process, and the yield may be increased, and the manufacturing process may be simplified through simple assembly.

Furthermore, there was an unstable portion in soldering in the past, which may affect the touch operation. However, in the touch input device 100 according to an exemplary embodiment of the present invention, the connection member 200 stably connects the printed circuit board 130 and the sensor electrode 120 by the contact method so that such a problem does not occur.

Figure 8:
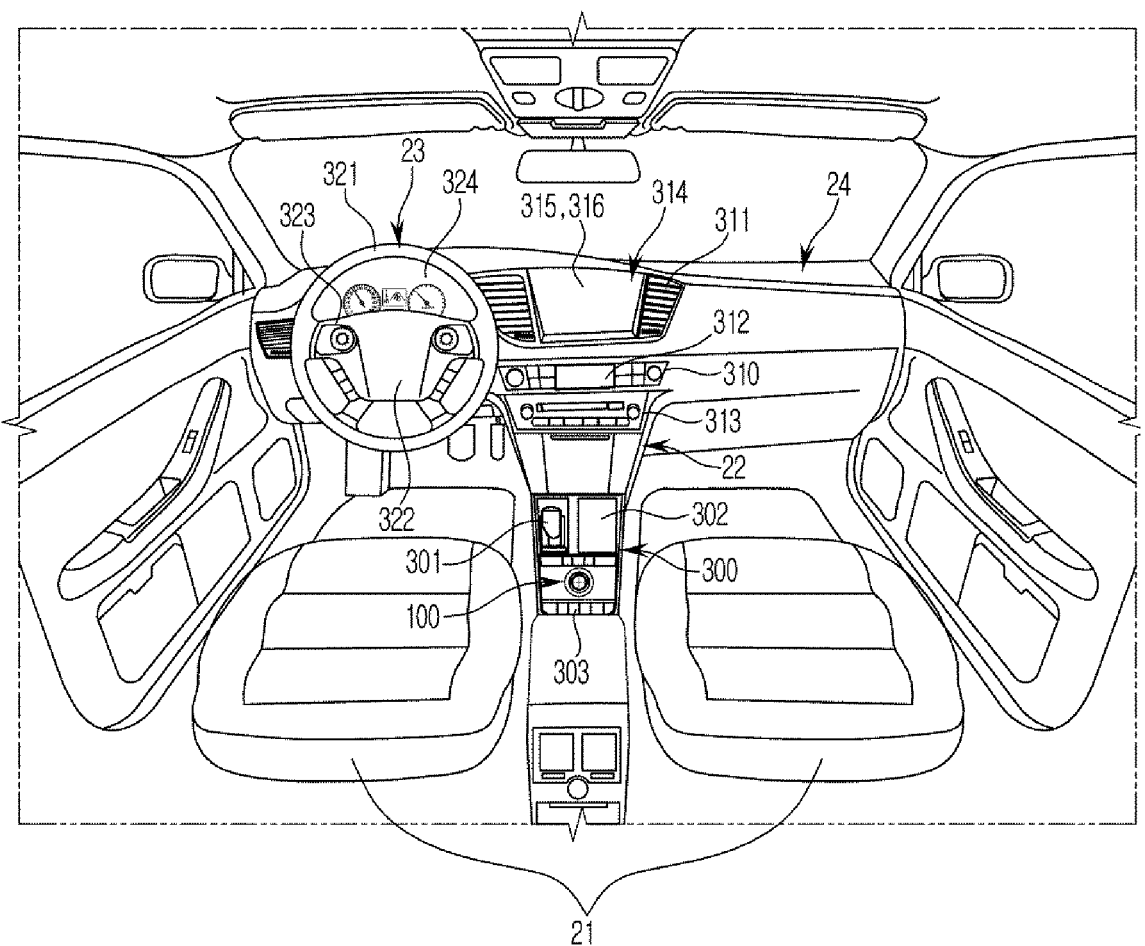
FIG. 8 is a view illustrating the internal of a vehicle provided with a touch input device according to an exemplary embodiment of the present invention.

FIG. 8 is a view illustrating an internal of a vehicle provided with a touch input device according to an exemplary embodiment of the present invention, and FIG. 9 is a perspective view illustrating a gear box provided with a touch input device according to an exemplary embodiment of the present invention.

Referring to FIG. 8, a vehicle 20 may include seats 21 reserved for a driver and passengers to sit on, a gearbox 300, a center fascia 22 and a dashboard 24 having a steering wheel 23.

In the center fascia 22, an air conditioner 310, a clock 312, an audio system 313, and an Audio, Video, and Navigation (AVN) system 314 may be disposed.

The air conditioner 310 keeps the atmosphere within the vehicle 20 pleasant by adjusting the temperature, humidity, air cleanness, and air flow within the vehicle 20. The air conditioner 310 may include at least one vent 311 disposed in the center fascia 22 for venting air. There may also be buttons or dials disposed in the center fascia 22 to control e.g., the air conditioner 310. The driver or the user may control the air conditioner 310 with the buttons disposed on the center fascia 22.

The clock 312 may be disposed around the buttons or dials provided to control the air conditioner 310.

The audio system 313 may include a control panel on which a number of buttons are mounted to operate the audio system 313. The audio system 313 may provide a radio mode for radio listening and a media mode for reproducing audio files stored in various storage media.

The AVN system 314 may be embedded in the center fascia 22 of the vehicle 20, or may be disposed out on the dashboard 24. The AVN system 314 is a system for comprehensively performing audio, video and navigation functions according to manipulation of the user. The AVN system 314 may include an input device 315 for receiving user commands regarding the AVN system 314, and a display 316 for displaying a screen related to audio play, video play, or navigation functions. The audio system 313 may be omitted if it overlaps with the AVN system 314.

The steering wheel 23 is a tool to control a traveling direction of the vehicle 20, including a rim 321 to be held by the driver and a spoke 322 connected to a steering system of the vehicle 20 and connecting the rim 321 to a hub of a rotation shaft for steering. In the exemplary embodiment of the present invention, a control device 323 may be provided on the spoke 322 to control various devices in the vehicle 20, e.g., the audio system.

The dashboard 24 may further include an instrument panel 324 for indicating various vehicle information for the driver, such as the vehicle speed, traveled distance, engine revolutions per minute (rpm), fuel amount remaining, temperature of a coolant, various warnings, etc., and a glove box for including various things.

The gearbox 300 may be disposed between the driver seat and the passenger seat within the vehicle 20, and provided with various control devices required to be manipulated by the driver while the driver is driving the vehicle 20.

Referring to FIG. 9, in the gearbox 300, a transmission lever 301 for transmission of the vehicle 20, a display 302 for controlling the vehicle 20 to perform functions, and buttons 303 for activating various devices of the vehicle 20 may be disposed. Furthermore, the touch input device 100 according to the exemplary embodiment of the present invention may be disposed in the gearbox 300.

The touch input device 100 disposed in the gearbox 300 may be positioned such that the user may be able to manipulate the touch input device 100 while keeping his/her eyes forward. For example, the touch input device may be located down the transmission lever 301. Alternatively, the touch input device 100 may be disposed in the center fascia 22, in the steering wheel 23, in the passenger seat, or in the back seat.

The touch input device 100 may be connected to display devices within the vehicle 20 for selecting and executing various icons displayed in the display devices. The display devices disposed within the vehicle 20 may include the audio system 313, the AVN system 314, the instrument panel 324, or the like. Alternatively, the display 302 may be disposed in the gearbox 300. The display device may be connected to a Head-Up Display (HUD) device or a rear view mirror.

For example, the touch input device 100 may move a cursor or execute an icon displayed on the display device. The icon may include a main menu icon, a menu selection icon, a menu setting icon, etc. Furthermore, the user may operate a navigation device, or set driving conditions, or activate peripheral devices in the vehicle 20 through the touch input device 100.

Figure 10:
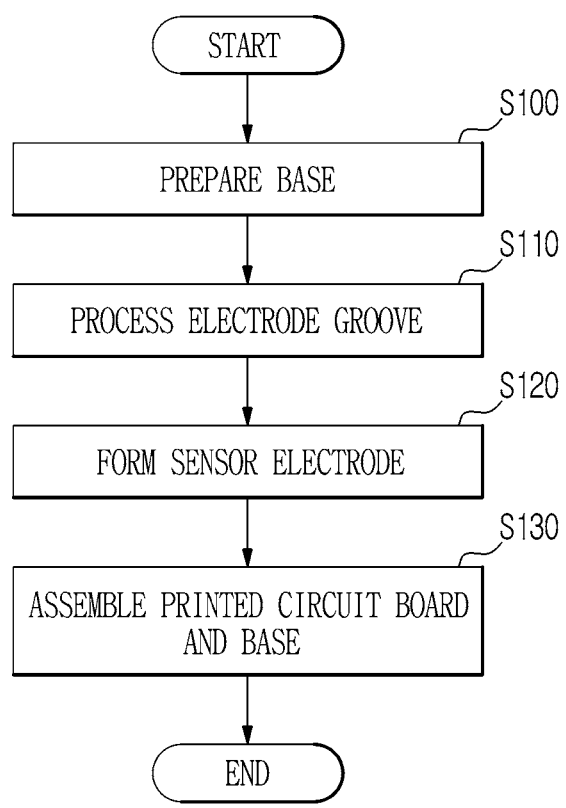
FIG. 10 is a flowchart showing a method for manufacturing a touch input device according to an exemplary embodiment of the present invention.

FIG. 10 is a flowchart showing a method for manufacturing a touch input device according to an exemplary embodiment of the present invention.

The base 110 may include a metal complex. For example, the base 110 may be a complex including resins and metal oxides. The resins may include one or more of Polycarbonate (PC), Polyamide (PA), and acrylonitrile-butadiene-styrene copolymer (ABS), and the metal oxides may include one or more of Mg, Cr, Cu, Ba, Fe, Ti, and Al.

The base 110 may be formed by injection molding. The base 110 may be formed by injection molding a metal complex, or by coating a metal complex on one side of a material such as resin, glass, or leather.

The base 110 may have a curved surface or a polygonal surface on one side thereof. For example, a curved surface may be formed on one surface of the base 110 (S100).

The electrode groove 113 may be formed by irradiating a laser, such as a UV laser or Excimer laser onto one side of the base 110. The heat generated while the groove is being formed breaks the chemical bond of the metal complex to be reduced to a metal, forming a metal seed in the electrode groove 113.

The electrode groove 113 may be formed on the one side of the base 110. Since the groove is formed by laser irradiation, various patterns may be made without regard to the surface form of the base 110 (S110).

The sensor electrode 120 may be formed by metalizing the electrode groove 113 that exposes the metal seed. For example, the sensor electrode 120 may include copper to be plated in the electrode groove 113. For the anti-oxidation process, nickel may be plated on the copper plating (S120).

The printed circuit board 130 and the base 110 may be assembled without a separate fastening mechanism. The connection member 200 may be provided on the printed circuit board 130. The sensor IC 131 may be mounted on the printed circuit board 130 to sense a change in capacitance of the sensor electrode 120.

The printed circuit board 130 may be assembled to the lower surface of the base 110 such that the connection member 200 comes into contact with the connection portion 115 of the base 110. At the present time, soldering or a separate fastening process is not required. Therefore, the manufacturing process may be simplified and the productivity may be improved.

The support 150 may be coupled to the lower surface of the base 110 such that the printed circuit board 130 may be fixed to the base 110 (S130).

As is apparent from the above description, in accordance with the exemplary embodiments of the present invention, it may be possible to provide a touch input device including a connection member electrically connecting a sensor electrode and a printed circuit board by contact without soldering, and a method for manufacturing the touch input device.

It may also be possible to provide a touch input device having a reduced rate of defects and improved production yield, and a method for manufacturing the touch input device.

It may also be possible to provide a touch input device in which the manufacturing cost is reduced and productivity is improved by simplifying the manufacturing process, and a method for manufacturing the touch input device.

For convenience in explanation and accurate definition in the appended claims, the terms "upper", "lower", "internal", "outer", "up", "down", "upper", "lower", "upwards", "downwards", "front", "rear", "back", "inside", "outside", "inwardly", "outwardly", "internal", "external", "internal", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A touch input device comprising:
   a base including a metal complex; and
   a printed circuit board disposed below the base and separately coupled to the base,
   wherein the base includes:
      an electrode groove formed on the base by irradiating a laser; and
      a sensor electrode formed on the electrode groove through a plating process or a deposition process, the sensor electrode including a conductive material;
   wherein the printed circuit board includes:
      a sensor IC mounted on the printed circuit board to detect a change in capacitance of the sensor electrode; and
      a connection member provided on the printed circuit board and configured to electrically connect the sensor electrode and the printed circuit board, and
   wherein the connection member elastically contacts with the sensor electrode to connect the sensor electrode and the printed circuit board when the printed circuit board is coupled to the base.

2. The touch input device according to claim 1, wherein the connection member is detachably coupled to the sensor electrode.

3. The touch input device according to claim 1, Wherein the connection member includes a conductive material.

4. The touch input device according to claim 1, wherein the base includes at least one bent or curved surface, and the electrode groove and the sensor electrode are formed on the at least one bent surface or the curved surface.

5. The touch input device according to claim 1, wherein an end portion of the sensor electrode extends to a position corresponding to the connection member to contact with the connection member.

6. The touch input device according to claim 5, wherein the base includes a touch area configured to receive a touch input of a user and a peripheral portion extending downward from an external edge of the touch area, and
   wherein the sensor electrode extends from the touch area to the peripheral portion.

7. The touch input device according to claim 1, wherein the connection member is coupled to the printed circuit board by soldering.

8. The touch input device according to claim 1, wherein the connection member is configured to be elastically deformable to maintain connection with the sensor electrode when vibration occurs in the base and the printed circuit board.

9. The touch input device according to claim 1, wherein the sensor IC is elastically connected to the sensor electrode.

10. The touch input device according to claim 1, wherein the sensor electrode includes first sensor electrodes directly connected to each other on an upper surface of the base and second sensor electrodes separated from each other on the upper surface of the base.

11. The touch input device according to claim 10,
    wherein the electrode groove includes first electrode grooves and second electrode grooves, and
    wherein the first sensor electrodes are formed on the first electrode grooves formed on the upper surface of the base and the second sensor electrodes are formed on the second electrode grooves formed on the upper surface of the base.

12. The touch input device according to claim 10, wherein the second sensor electrodes are connected to each other through holes formed in a touch area of the base.

13. The touch input device according to claim 10, wherein the second sensor electrodes are connected by connection electrodes formed on a lower surface of the base.

14. The touch input device according to claim 13, wherein the connection electrodes are formed on third electrode grooves formed on the lower surface of the base.

15. A method for manufacturing a touch input device, the method comprising:
    forming an electrode groove by irradiating a laser on a base including a metal complex;
    forming a sensor electrode including a conductive material on the electrode groove through a plating process or a deposition process; and
    coupling a printed circuit board including a connection member to a lower side of the base,
    wherein the coupling of the minted circuit board to the lower side of the base includes electrically connecting the sensor electrode and the printed circuit board by elastically contacting the connection member with the sensor electrode.

* * * * *